United States Patent
Natsui et al.

(10) Patent No.: US 6,807,121 B2
(45) Date of Patent: Oct. 19, 2004

(54) SEMICONDUCTOR MEMORY DEVICE FOR REALIZING EXTERNAL 8K REF/INTERNAL 4K REF STANDARD WITHOUT LENGTHENING THE REFRESH CYCLE

(75) Inventors: Shun Natsui, Tokyo (JP); Hiroki Fujisawa, Tokyo (JP)

(73) Assignee: Elpida Memory, Inc. (JP)

( * ) Notice: Subject to any disclaimer, the term of this patent is extended or adjusted under 35 U.S.C. 154(b) by 31 days.

(21) Appl. No.: 10/292,968

(22) Filed: Nov. 13, 2002

(65) Prior Publication Data

US 2003/0112689 A1 Jun. 19, 2003

(30) Foreign Application Priority Data

Dec. 19, 2001 (JP) ........................................ 2001-386127

(51) Int. Cl.$^7$ ................................................ G11C 11/00
(52) U.S. Cl. ....................... 365/222; 365/236; 365/239; 365/230.06; 365/230.03; 365/230.09
(58) Field of Search ................................. 365/222, 236, 365/239, 230.03, 230.06, 230.09

(56) References Cited

U.S. PATENT DOCUMENTS

| | | | | |
|---|---|---|---|---|
| 5,970,001 A | * | 10/1999 | Noda et al. | 365/200 |
| 6,078,543 A | * | 6/2000 | Kim | 365/230.03 |
| 6,134,176 A | * | 10/2000 | Proebsting | 365/230.06 |
| 6,212,089 B1 | * | 4/2001 | Kajigaya et al. | 365/51 |
| 6,515,913 B2 | * | 2/2003 | Kajigaya et al. | 365/189.02 |
| 6,590,815 B2 | * | 7/2003 | Mine | 365/200 |
| 6,608,772 B2 | * | 8/2003 | Ooishi | 365/63 |
| 6,657,901 B2 | * | 12/2003 | Kajigaya et al. | 365/189.02 |
| 2001/0008498 A1 | * | 7/2001 | Ooishi | 365/230.03 |
| 2003/0043672 A1 | * | 3/2003 | Inoue et al. | 365/222 |

FOREIGN PATENT DOCUMENTS

| | | | | | |
|---|---|---|---|---|---|
| JP | 411250694 A | * | 9/1999 | | G11C/29/00 |
| JP | 02003187578 A | * | 7/2003 | | G11C/11/406 |

* cited by examiner

*Primary Examiner*—Viet Q. Nguyen
(74) *Attorney, Agent, or Firm*—Hayes Soloway P.C.

(57) ABSTRACT

A semiconductor memory device is disclosed that realizes the external-8K Ref/internal-4K Ref standard without lengthening the refresh cycle. Successive selection and simultaneous activation of two normal word lines that do not belong to the same mat is first carried out while preventing replacement by redundant word lines by activating a redundancy non-access signal; following which successive selection and simultaneous activation of two redundant word lines that do not belong to the same mat is carried out while preventing the activation of normal word lines by activating a redundancy access signal. Since the refreshing of normal word lines and refreshing of redundant word lines are each performed while preventing replacement of normal word lines by redundant word lines, two word lines in the same mat are not simultaneously activated even though two word lines are refreshed by means of one refresh command.

4 Claims, 18 Drawing Sheets

US 6,807,121 B2

SEMICONDUCTOR MEMORY DEVICE FOR REALIZING EXTERNAL 8K REF/INTERNAL 4K REF STANDARD WITHOUT LENGTHENING THE REFRESH CYCLE

BACKGROUND OF THE INVENTION

1. Field of the Invention

The present invention relates to a semiconductor memory device such as DRAM (Dynamic Random Access Memory), and more particularly to a refresh control method for controlling the refresh operation in a semiconductor memory device that includes a memory cell array that is constituted by a plurality of mats equipped with normal word lines and redundant word lines.

2. Description of the Related Art

DRAMs store data by accumulating a charge in capacitors and therefore require refresh operations to be performed at a fixed cycle due to the leakage of the capacitor charge over the passage of time. These refresh operations are performed by successively activating word lines, reading the data of module cells that are connected to the activated word lines, amplifying the difference in potential by means of a sense amplifier, and rewriting to the original memory cells.

For example, refreshing a 64-kbits memory cell by means of a refresh command necessitates the input of 4000 (=256 Mbits/64 kbits) refresh commands to refresh all of the memory cells of a 256-Mbits semiconductor memory device. If refresh commands are applied at intervals of 7.8 $\mu$s, the time required to refresh all memory cells (hereinbelow referred to as the "refresh cycle") 7.8 $\mu$s×4 k=32 ms. If the storage capacity in such a semiconductor memory device is increased to, for example, 512 Mbits, 8K refresh operations, i.e., 64 ms, is required to refresh all memory cells.

Due to the increase in storage capacity of semiconductor memory devices in recent years, however, designs for miniaturization of patterns have resulted in a decrease in the capacitance of capacitors for storing data. In addition, designs in which the operating voltage is lowered in order to increase operating speed have resulted in a lowering of the voltage that is applied to capacitors. Also, since the amount of charge that is stored in capacitors is determined as the product of the capacitance of the capacitors and the applied voltage, recent years have seen a downward trend in the amount of charge that is accumulated in capacitors in semiconductor memory devices. Failure to carry out the refresh operation before the disappearance of the charge that is stored in capacitors results in the destruction of the data that are held, and it has therefore been necessary in recent years to shorten the refresh cycle in semiconductor memory devices. Thus, when the storage capacity is increased from 256 Mbits to 512 Mbits, the refresh cycle must be kept the same as for the 256-Mbit storage capacity.

When the refresh operation is carried out in 32 ms for all memory cells of 512 Mbits, the above-described object can be achieved by changing the interval for inputting refresh commands from 7.8 $\mu$s to 3.9 $\mu$s, or to one-half the original interval. In actual DRAM control, however, processing for data reading and writing is also performed in addition to the refresh operation, and an increase in processing for refresh operations therefore causes the speed of data reading and writing to fall, and the interval for performing processing for refresh operations therefore cannot be made shorter than 7.8 $\mu$s.

To satisfy all of these conditions, the refresh operation for all memory cells of 512 Mbits must be carried out at a refresh cycle of 32 ms with the interval for the input of refresh commands kept at 7.8 $\mu$s.

Here, an external 8K Ref/internal 4K Ref standard has been adopted in the DDR (Double Data Rate) II mode that has been investigated by JEDEC (Joint Electron Device Engineering Council). As shown in FIG. 1a, this external 8K Ref/internal 4K Ref standard is a standard in which, if all memory cells (512 Mbits) are refreshed by executing 8K (8192) refresh commands in 64 ms in the prior art, all memory cells (512 Mbits) are refreshed in 32 ms by refresh commands that are applied from the outside at the same cycle as in the prior art, i.e., by the input of 4K refresh commands.

Two methods can be considered when putting this external 8K Ref/internal 4K Ref standard into practice: a method as shown in FIG. 1b in which the refresh operation is carried out for twice as many word lines as the prior art by one refresh command; and a method as shown in FIG. 1c in which two refresh operations are performed serially within a chip by a single refresh command.

However, in a typical semiconductor memory device, redundant memory cells are supplied to provide a remedy for defective cells. Replacing word lines that contain defective memory cells with redundant word lines can save the entire semiconductor memory device from being rendered defective. However, these redundant word lines raise problems when the methods shown in FIGS. 1b and 1c are used.

The following explanation regards a case in which one memory cell array is constituted by 16 mats, each mat being made up by 512 word lines and 8 redundant word lines. FIG. 2 shows the memory cell array of a semiconductor memory device of this configuration. The memory cell array shown in this FIG. 2 is made up of 16 mats $10_0$–$10_{15}$, each of mats $10_0$–$10_{15}$ being made up of 512 word lines and 8 redundant word lines, and each of mats $10_0$–$10_{15}$ being provided with a respective sense amplifier $9_0$–$9_{15}$. Redundant word lines are provided in a dispersed arrangement on each mat rather than in a concentrated arrangement because the failure of memory cells generally does not occur randomly but tends to occur in groups, resulting from, for example, the admixture of impurities in the process of fabricating the semiconductor memory device.

In a semiconductor memory device of this configuration, 64 bits of memory cells are refreshed by the selection of one word line. As a result, activating (512+8)×16=8320 word lines one at a time enables refreshing of all memory cells.

In contrast to the semiconductor memory device of this configuration, the external 8K Ref/internal 4K Ref standard can be realized if, when attempting to refresh 128 bits, i.e., twice the number of memory cells as in the prior art, by one refresh command, two word lines are activated and refreshed by the input of one refresh command as described in the foregoing explanation and as shown in FIG. 1b. In a semiconductor memory device that contains the memory cell array shown in FIG. 2, however, each of mats $10_0$–$10_{15}$ share sense amplifiers $9_0$–$9_{16}$, and when two word lines are simultaneously activated in the same mat, the stored data are destroyed.

In this type of semiconductor memory device, moreover, the replacement of any redundant word line and any normal word line in the same memory cell array is enabled in order to raise the replacement efficiency. For example, the configuration allows a word line of mat $10_1$ to be replaced by a redundant word line of mat $10_{15}$. When such replacement of defective word lines and redundant lines that exceeds the range of one mat is performed, the activation of a normal word line within a particular mat is in actuality the activation of a redundant word line in a different mat. As a result, even though two word lines that belong to different mats are to be selected and activated to carry out a refresh operation, in some cases, two word lines in the same mat may be activated.

For example, as shown in FIG. 3, we consider a case in which, in order to simultaneously activate and refresh two word lines through the input of one refresh command, a method is employed of successively activating normal word lines having row addresses that are shifted by 4096, i.e., normal word line 0 and normal word line 4096, normal word line 1 and normal word line 4097, and so on. In such a case, word line 0 belonging to mat $10_0$ is replaced by redundant word line R64 belonging to mat $10_8$, and word line 8191 belonging to mat $10_{15}$ is replaced by redundant word line R63 belonging to mat $10_7$. In this case, the intended simultaneous activation of normal word line 0 and normal word line 4096 actually results in the simultaneous activation of normal word line 4096 and redundant word line R64, whereby two word lines in mat $10_8$ are simultaneously activated and data are destroyed. Further, the intended simultaneous activation of normal word line 4095 and normal word line 8191 actually results in the simultaneous activation of normal word line 4095 and redundant word line R63, whereby two word lines in mat $10_7$ are simultaneously activated and data are destroyed.

Alternatively, the method shown in FIG. 1c can be considered in which the external 8K Ref/internal 4K Ref standard is realized by performing two serial refresh operations in a chip by means of one refresh command.

However, as described in the foregoing explanation, when the replacement of a defective word line and redundant word line exceeds the range of the same mat, the serial activation of two word lines necessitates the consideration of consecutive activation of word lines in the same mat.

For example, as shown in FIG. 4, in order to perform a refresh operation by consecutively activating two word lines by the input of one refresh command, the use of a method can be considered in which combinations of normal word lines having row addresses that are separated by 4096 are successively activated, e.g., normal word line 0 and normal word line 4096, normal word line 1 and normal word line 4097, and so on. In such a case, word line 0 belonging to mat $10_0$ is replaced by redundant on word line R64 belonging to mat $10_8$, and word line 8191 belonging to mat $10_{15}$ is replaced by redundant word line R63 belonging to mat $10_7$. In this case, when normal word line 0 and normal word line 4096 are to be consecutively activated, in actuality, normal word line 4096 and redundant word line R64 are consecutively activated, whereby two word lines in mat $10_8$ are consecutively activated. In addition, the intended consecutive activation of normal word line 4095 and normal word line 8191 actually results in the consecutive activation of normal word line 4095 and redundant word line R63, whereby two word lines in mat $10^7$ are consecutively activated.

When word lines that share a sense amplifier are to be consecutively activated, activation of the succeeding word line cannot be realized until the bit line selection, bit line amplification by the sense amplifier, and bit line precharging have been carried out for the previous word line.

In other words, the time tRFC for one refresh operation is 2×(internal tRAS (Row Address Strobe)+internal tRP (RAS Precharge) as shown in FIG. 5, which is twice the tRFC of the 8K Ref standard, and this results in the same problem that was encountered when the interval of input of refresh commands is set to 3.9 μs from 7.8 μs, i.e., a decrease in operating speeds for operations other than refresh, such as for reading and writing data.

SUMMARY OF THE INVENTION

It is an object of the present invention to provide a semiconductor memory device and a refresh control method that can realize the external 8K Ref/internal 4K Ref standard without damaging stored data, and moreover, without increasing the time tRFC for one refresh operation.

To achieve the above-described object, the semiconductor memory device of the present invention is a semiconductor memory device having a memory cell array that is constituted by a plurality of mats that are each provided with normal word lines and redundant word lines, the semiconductor memory device being provided with an X-system control circuit, a refresh counter, a remedy circuit, and an X-decoder.

Upon the input of a refresh command instructing a refresh operation, the X-system control circuit generates and outputs a refresh activation signal that indicates the start of a refresh operation, outputs a redundancy non-access signal for preventing replacement by redundant word lines when refreshing normal word lines, and outputs a redundancy access signal for preventing activation of normal word lines when refreshing redundant word lines.

Upon the input of a refresh activation signal from the X-system control circuit, the refresh counter successively generates and outputs addresses for selecting two normal word lines that do not belong to the same mat with each input of a refresh activation signal, and after having generated addresses for selecting all normal word lines, successively generates addresses for selecting two redundant word lines that do not belong to the same mat with each input of a refresh activation signal and outputs these generated addresses as refresh addresses.

The remedy circuit activates a normal word line selection signal for enabling selection of normal word lines when the redundancy non-access signal is active, and activates a redundant word line selection signal for enabling selection of redundant word lines when the redundancy access signal is active.

The X-decoder simultaneously activates two normal word lines instructed by the refresh addresses when the normal word line selection signal is active, and simultaneously activates two redundant word lines that are instructed by the refresh addresses when the redundant word line selection signal is active.

According to the present invention, refreshing of normal word lines and refreshing of a redundant word lines are each performed while preventing replacement of normal word lines by redundant word lines, and as a result, two word lines in the same mat will not be simultaneously activated even when two word lines are refreshed by one refresh command. Thus, the external 8K Ref/internal 4K Ref standard can be realized without destroying stored data.

Another semiconductor memory device of the present invention is similarly provided with an X-system control circuit, a refresh counter, a remedy circuit, and an X-decoder.

Upon the input of a refresh command instructing a refresh operation, the X-system control circuit generates and outputs two refresh activation signals that indicate the start of refresh operations, outputs a redundancy non-access signal for preventing replacement by redundant word lines when refreshing normal word lines, and outputs a redundancy access signal for preventing activation of normal word lines when refreshing redundant word lines.

Upon the input of a refresh activation signal from the X-system control circuit, the refresh counter successively generates and outputs addresses for selecting normal word lines such that preceding and succeeding addresses do not belong to the same mat with each input of a refresh activation signal, and after having generated addresses for selecting all normal word lines, successively generates addresses for selecting redundant word lines such that preceding and succeeding addresses do not belong to the same mat with each input of a refresh activation signal and outputs these generated addresses-as refresh addresses.

The remedy circuit activates a normal word line selection signal for enabling selection of normal word lines when the redundancy non-access signal is active, and activates a redundant word line selection signal for enabling selection of redundant word lines when the redundancy access signal is active.

The X-decoder consecutively activates two normal word lines that are instructed by the refresh addresses when the normal word line selection signal is active, and consecutively activates two redundant word lines that are instructed by the refresh addresses when the redundant word line selection signal is active.

According to the present invention, the refreshing of is normal word lines and the refreshing of redundant word line are each carried out while preventing replacement of normal word lines by redundant word lines, whereby two word lines in the same mat will not be consecutively activated even when two word lines are consecutively refreshed by one refresh command. As a result, after activating a particular word line, a next word line can be activated without waiting for bit-line amplification and bit-line precharging by a sense amplifier, i.e., by allowing processing to overlap. In this way, the external 8K Ref/internal 4K Ref standard can be realized without causing the time tRFC for one refresh operation to become double the tRFC of the 8K Ref standard. Further, the amount of refreshing that can be performed simultaneously is the same as in the prior art, and the array noise therefore does not increase compared to a prior-art semiconductor memory device.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1A:
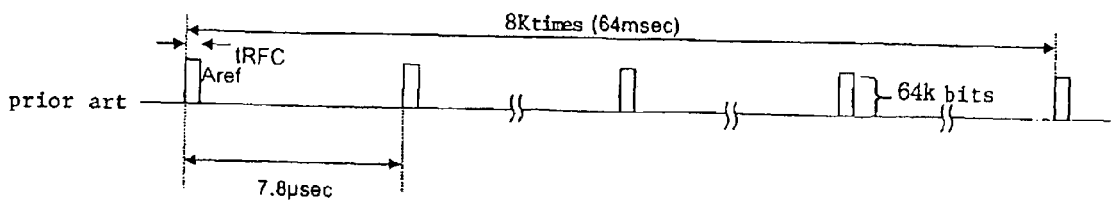
FIG. 1a shows the operation when performing the refreshing operation of a 512 Mbit memory cell by means of the method of the prior art.
Figure 1B:
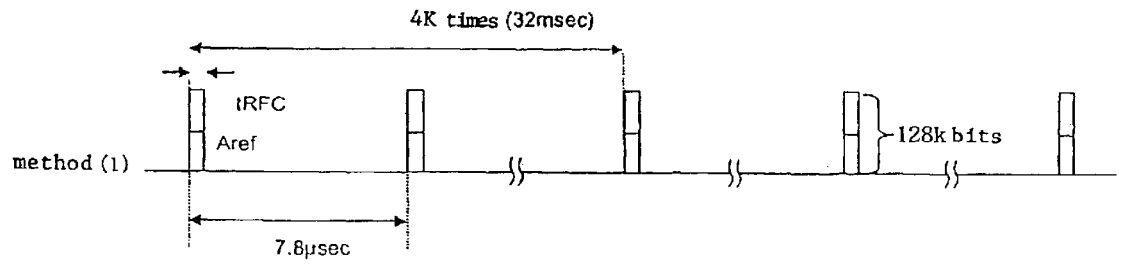
FIG. 1b shows the operation when two word lines are simultaneously activated by the input of one refresh command to realize the external 8K Ref/internal 4K Ref standard.
Figure 1C:
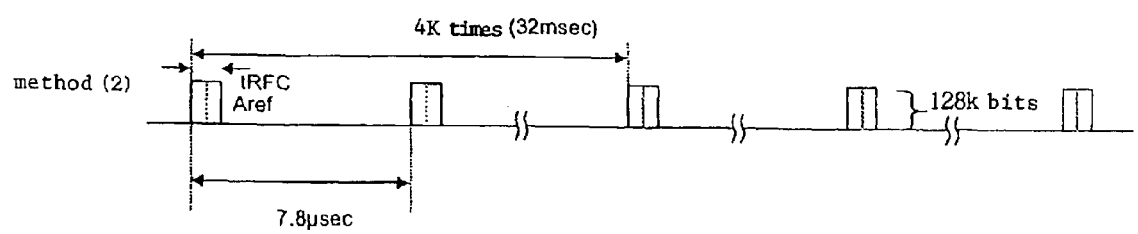
FIG. 1c shows the operation when two word lines are consecutively activated by the input of one refresh command to realize the external 8K Ref/internal 4K Ref standard.
Figure 2:
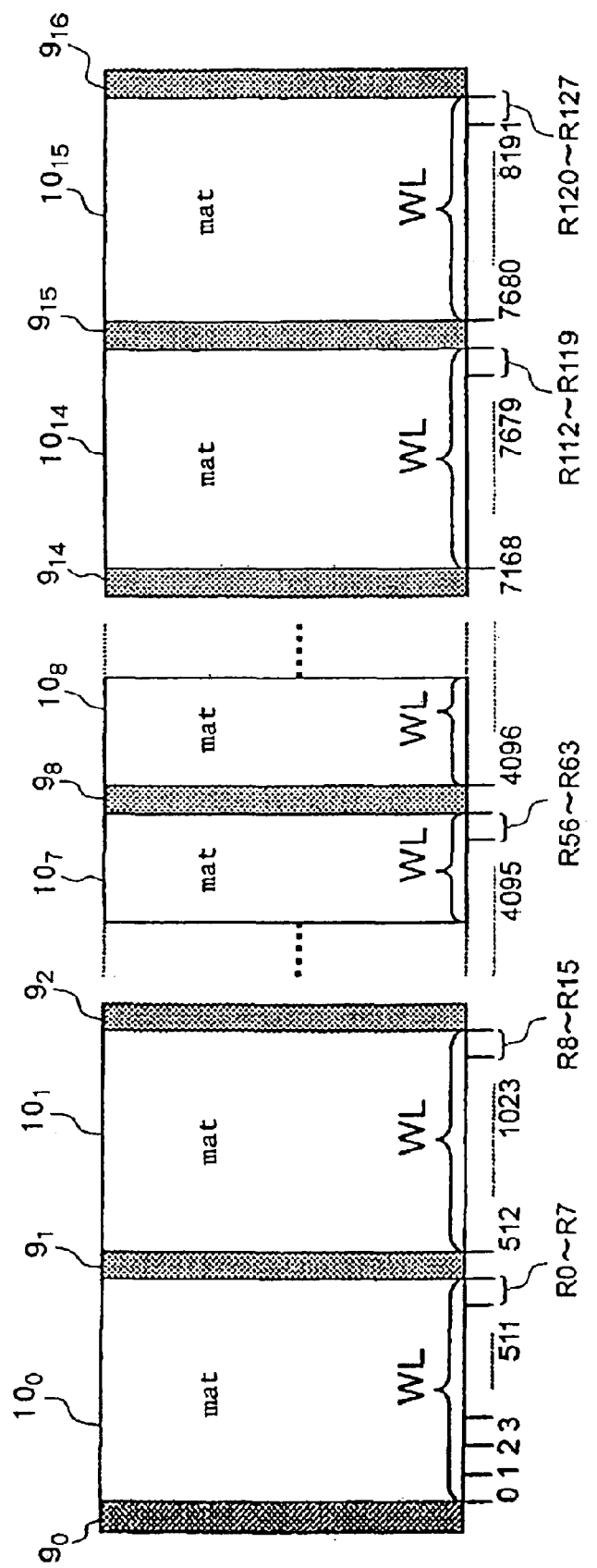
FIG. 2 shows the configuration of a memory cell array that is constituted by 16 mats.
Figure 3:
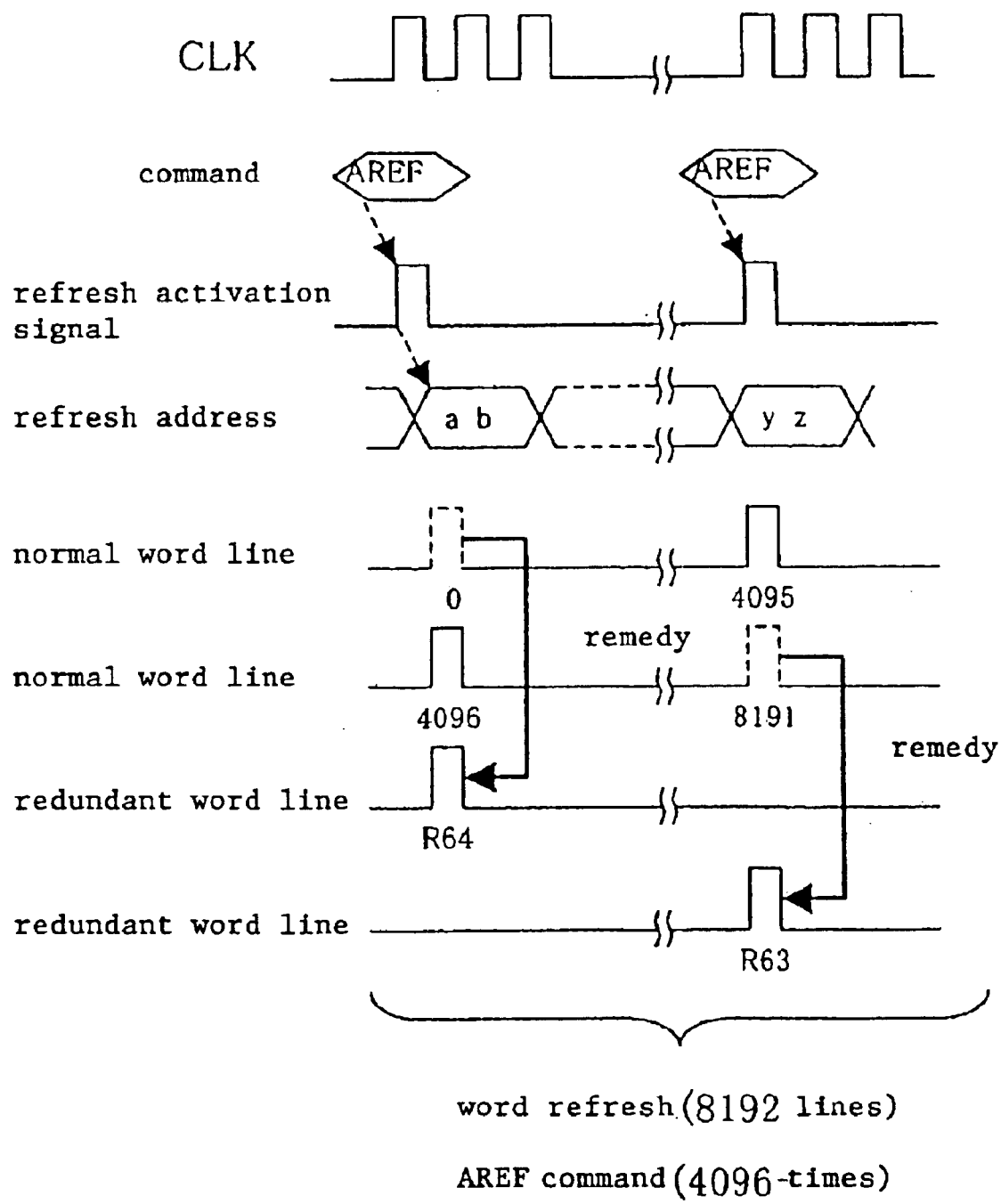
FIG. 3 is a timing chart showing the operation when two word lines are simultaneously activated by the input of one refresh command according to the refresh control method of the prior art.
Figure 4:
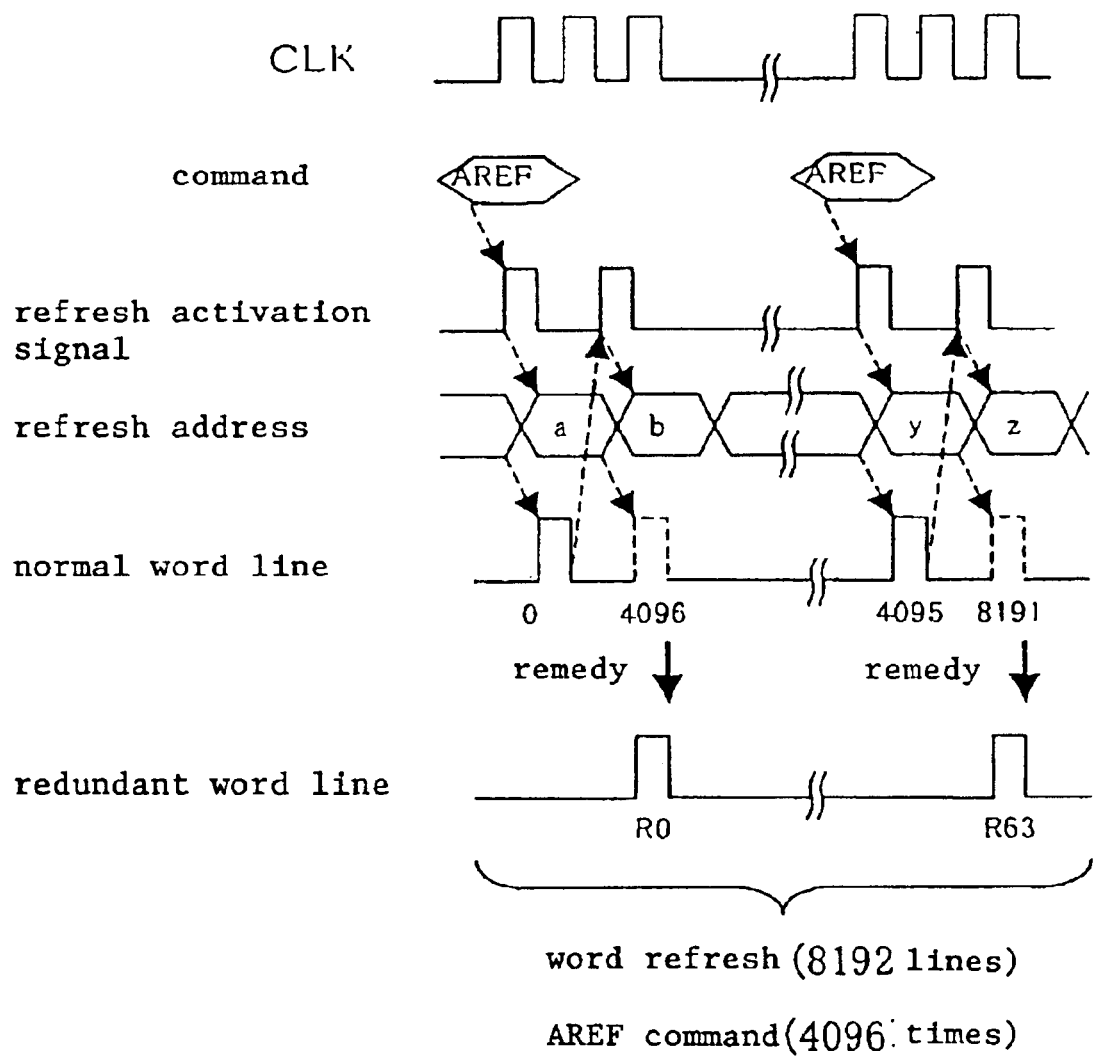
FIG. 4 is a timing chart showing the operation when two word lines are consecutively activated by the input of one refresh command according to the refresh control method of the prior art.
Figure 5:
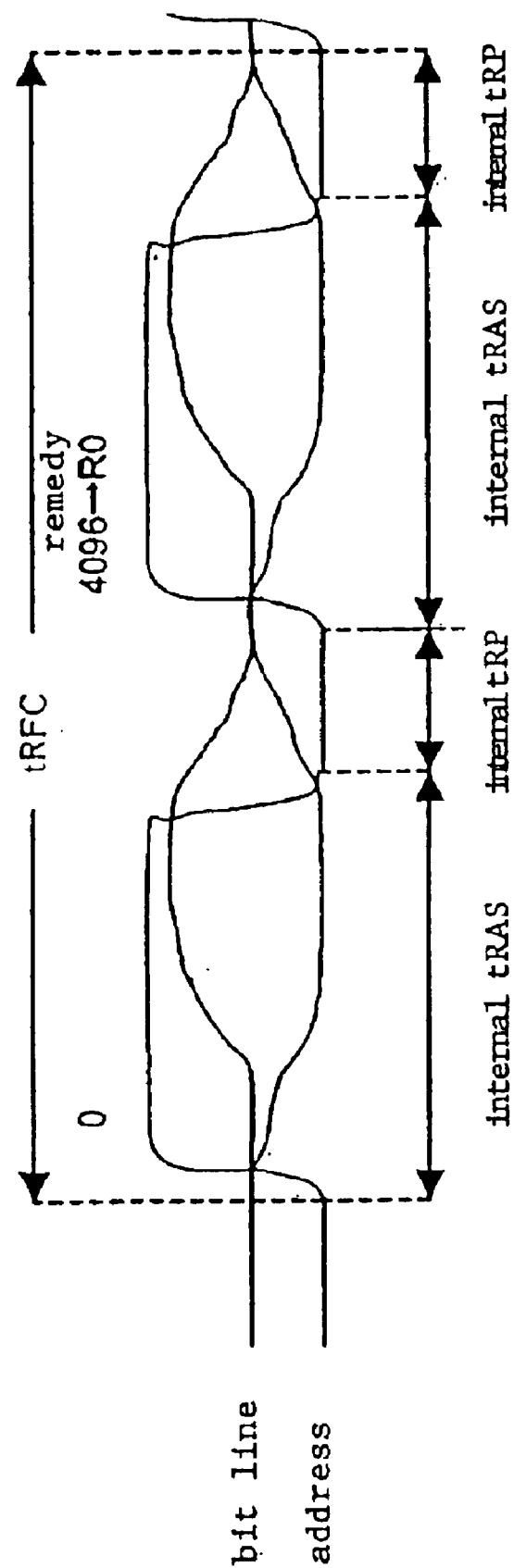
FIG. 5 is a timing chart showing the operation when two word lines are consecutively activated within the same mat.
Figure 6:
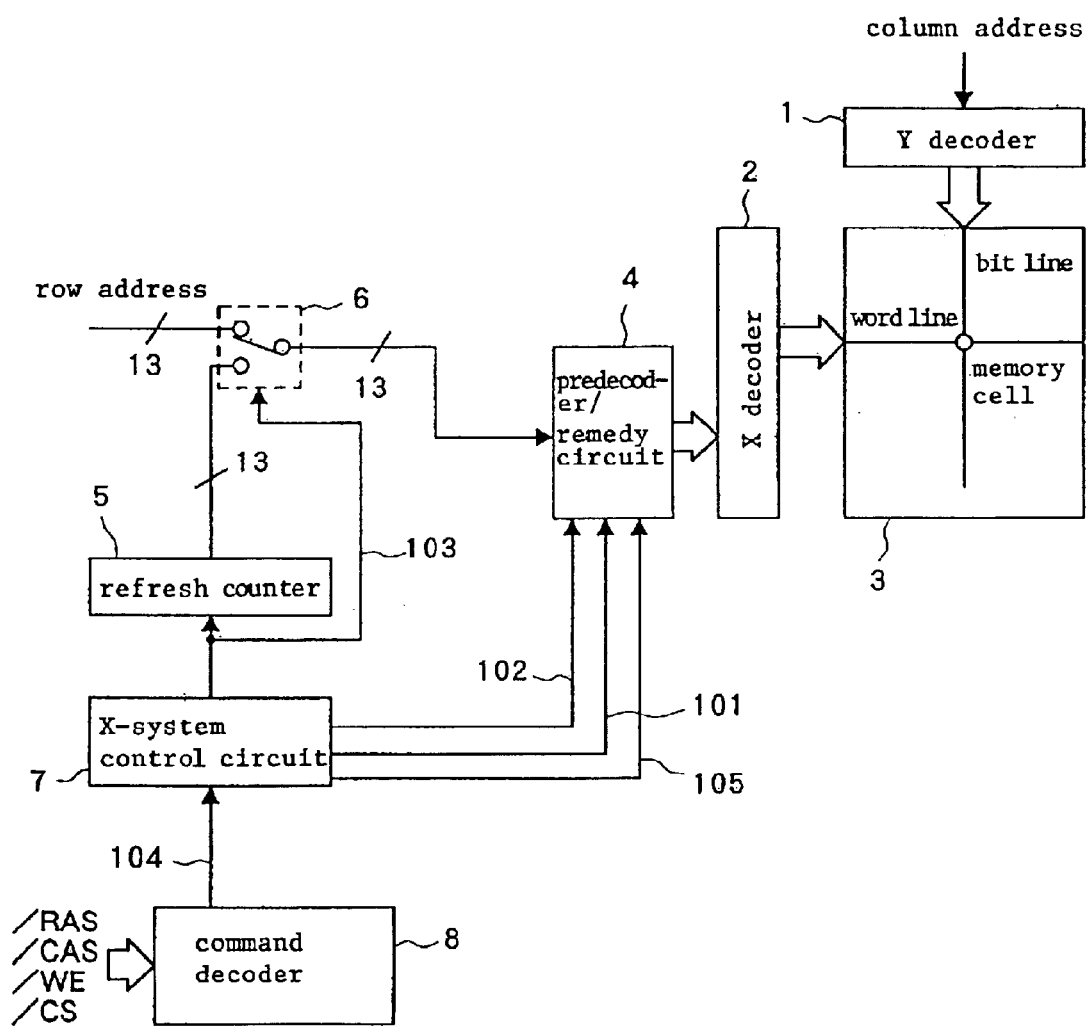
FIG. 6 is a block diagram showing the construction of a semiconductor memory device of the first embodiment of the present invention.

First Embodiment:

We now refer to FIG. 6, which is a block diagram showing the construction of the semiconductor memory device of the first embodiment of the present invention. The semiconductor memory device of this embodiment is provided with: Y-decoder 1, X-decoder 2, memory cell array 3, predecoder/remedy circuit 4, refresh counter 5, switch circuit 6, X-system control circuit 7, and command decoder 8.

Y-decoder 1 selects bit lines that are designated by column addresses that have been received as input. Command decoder 8 receives as input various control signals such as /CAS (Column Address Strobe), /RAS (Row Address Strobe), /WE (Write Enable), and /CS (Chip Select); reads and writes data to and from each memory cell of memory cell array 3; and controls the refresh operation. Command decoder 8 determines whether to perform the refresh operation or to read or write data through the logical combination of control signals that are received as input. In the following explanation, operations other than the refresh operation are not directly related to the present invention and are therefore omitted.

X-system control circuit 7 generates and outputs signals for controlling other circuits based on the type of command that has been determined by command decoder 8. However, since the present invention relates to the refresh operation, explanation will relate only to signals relating to the refresh operation.

Specifically, X-system control circuit 7, upon receiving refresh command 104 as input from command decoder 8, generates and outputs refresh activation signal 103 indicating the start of the refresh operation, outputs redundancy non-access signal 102 for preventing replacement by redundant word lines when refreshing normal word lines, and outputs redundancy access signal 101 for preventing activation of normal word lines when refreshing redundant word lines. In addition, X-system control circuit 7 outputs activation signal 105 when activating any word line.

Refresh counter 5, upon receiving refresh activation signal 103 as input from X-system control circuit 7, generates and outputs addresses for selecting two normal word lines that do not belong to the same mat with each input of refresh activation signal 103, and after having generated addresses for selecting all normal word lines, generates addresses for selecting two redundant word lines that do not belong to the same mat with each input of refresh activation signal 103 and outputs these addresses as refresh addresses. More specifically, refresh counter 5 in the present embodiment successively generates and outputs with each input of refresh activation signal 103 addresses for selecting normal word lines 0 and 4096, addresses for selecting normal word lines 1 and 4097, and so on up to addresses for selecting normal word line 4095 and 8191; and then successively generates and outputs addresses for selecting redundant word lines R0 and R64, addresses for selecting redundant word lines R1 and R65, and so on up to addresses for selecting redundant word lines R63 and R127.

During normal operation, switch circuit 6 outputs row addresses from the outside to predecoder/remedy circuit 4, but upon receiving as input refresh activation signal 103 from X-system control circuit 7, outputs refresh addresses that have been generated by refresh counter 5 to predecoder/remedy circuit 4.

Predecoder/remedy circuit 4 receives addresses from switch circuit 6 as input, performs predecoding, and outputs mat selection signals $46_0$–$46_{15}$ for selecting the mat that is designated by the received address and signals RF0T0–7, RF3T0–7, RF6T0–7 for designating which word lines to select in the mat. Predecoder/remedy circuit 4 further: receives as input redundancy non-access signal 102 for preventing replacement by redundant word lines, redundancy access signal 101 for performing replacement by redundant word lines, and activation signal 105; sets to high level normal word line selection signal 107 for enabling the selection of normal word lines and instructs the activation of normal word lines that have been instructed by addresses that have been received as input when redundancy non-access signal 102 is high level, i.e., active; and sets to high level redundancy word line selection signal 106 for enabling selection of redundant word lines and instructs the activation of redundant word lines that are instructed by addresses that have been received as input when redundancy access signal 101 is high level, i.e., active.

Figure 7:
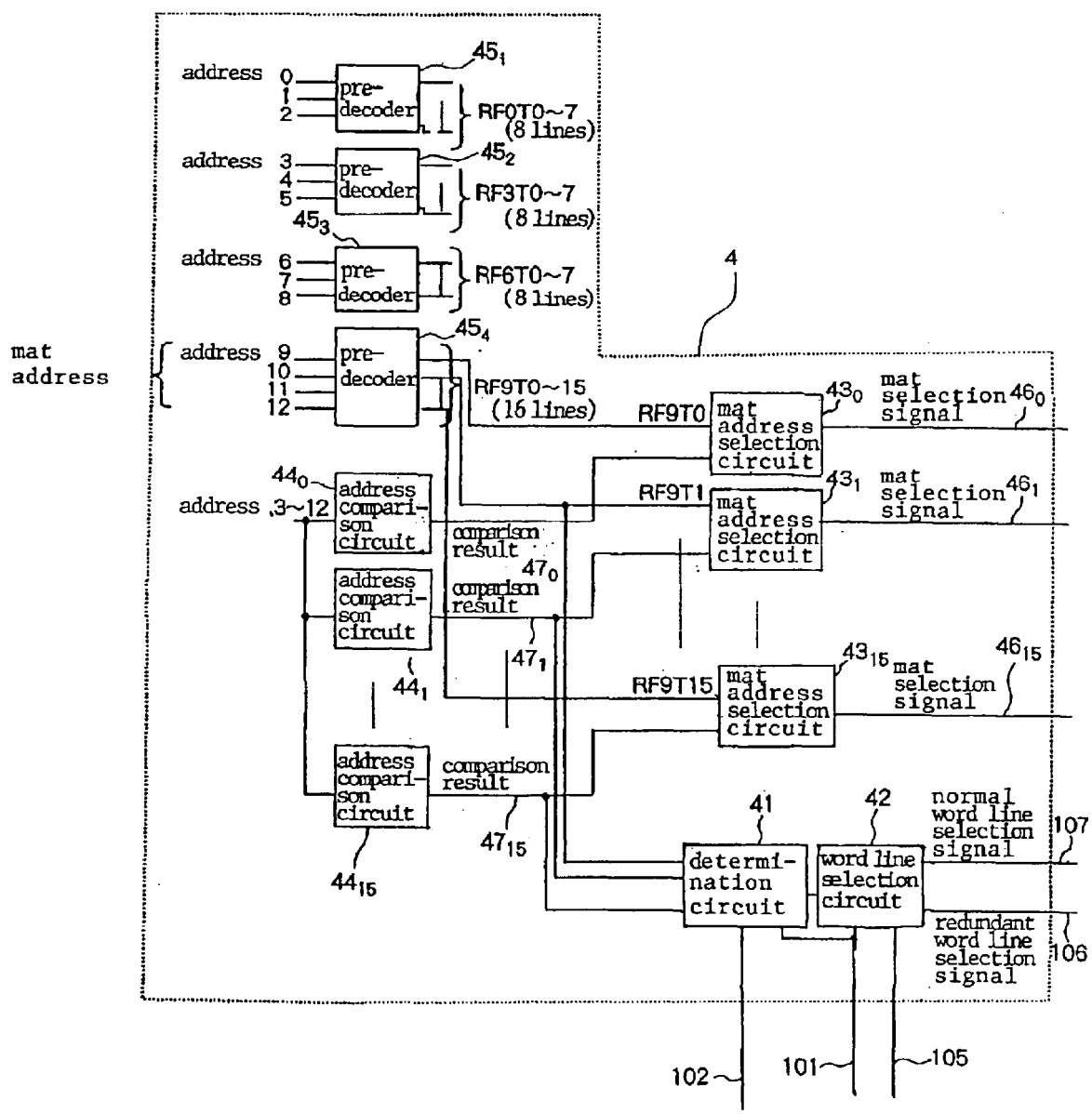
FIG. 7 is a block diagram showing the construction of predecoder/remedy circuit 4 in FIG. 6.

We next refer to FIG. 7, which shows the construction of predecoder/remedy circuit 4. Predecoder/remedy circuit 4 is constituted by determination circuit 41, word line selection circuit 42, mat address selection circuits $43_0$–$43_{15}$, address comparison circuits $44_0$–$44_{15}$, and predecoders $45_1$–$45_4$. Predecoders $45_1$–$45_4$ receive as input addresses 0–2, addresses 3–5, addresses 6–8, and addresses 9–12, respectively; predecode these addresses; convert them to signals RF0T0–7, RF3T0–7, RF6T0–7 and RF9T0–15, respectively, indicating which word lines of which mats are to be activated; and output the signals. Here, addresses 9–12 are mat addresses that indicate which mat to select. Signals RF9T0–7 that are output from predecoder $45_4$ are therefore signals indicating which word lines in a mat to activate.

The addresses of word lines that are to be replaced are registered in advance in address comparison circuits $44_0$–$44_{15}$ by the combination of fuse cutoffs, and when a received address matches a registered address, comparison results $47_0$–$47_{15}$ become high-level. When neither redundancy non-access signal 102 nor redundancy access signal 101 are high level and if any of comparison results $47_0$–$47_{15}$ from address comparison circuits $44_0$–$44_{15}$ is high level, determination circuit 41 makes its output signals low level.

Word line selection circuit 42 receives as input the signal from determination circuit 41 and redundancy access signal 101 and makes redundant word line selection signal 106 high level when the signal from determination circuit 41 indicates that a replacement is to be performed by a redundant word line or when redundancy access signal 101 is high-level. Word line selection circuit 42 otherwise makes normal word line selection signal 107 high-level.

When a replacement is not to be performed by means of a redundant word line, mat address selection circuits 430–4315 make mat selection signals $46_0$–$46_{15}$, respectively, high level when a signal corresponding to one of RF9T0–15 becomes high level, and make mat selection signals $46_0$–$46_{15}$, respectively, high level when a replacement is to be performed by means of a redundant word line in a mat corresponding to one of mats $10_0$–$10_{15}$.

Figure 8:
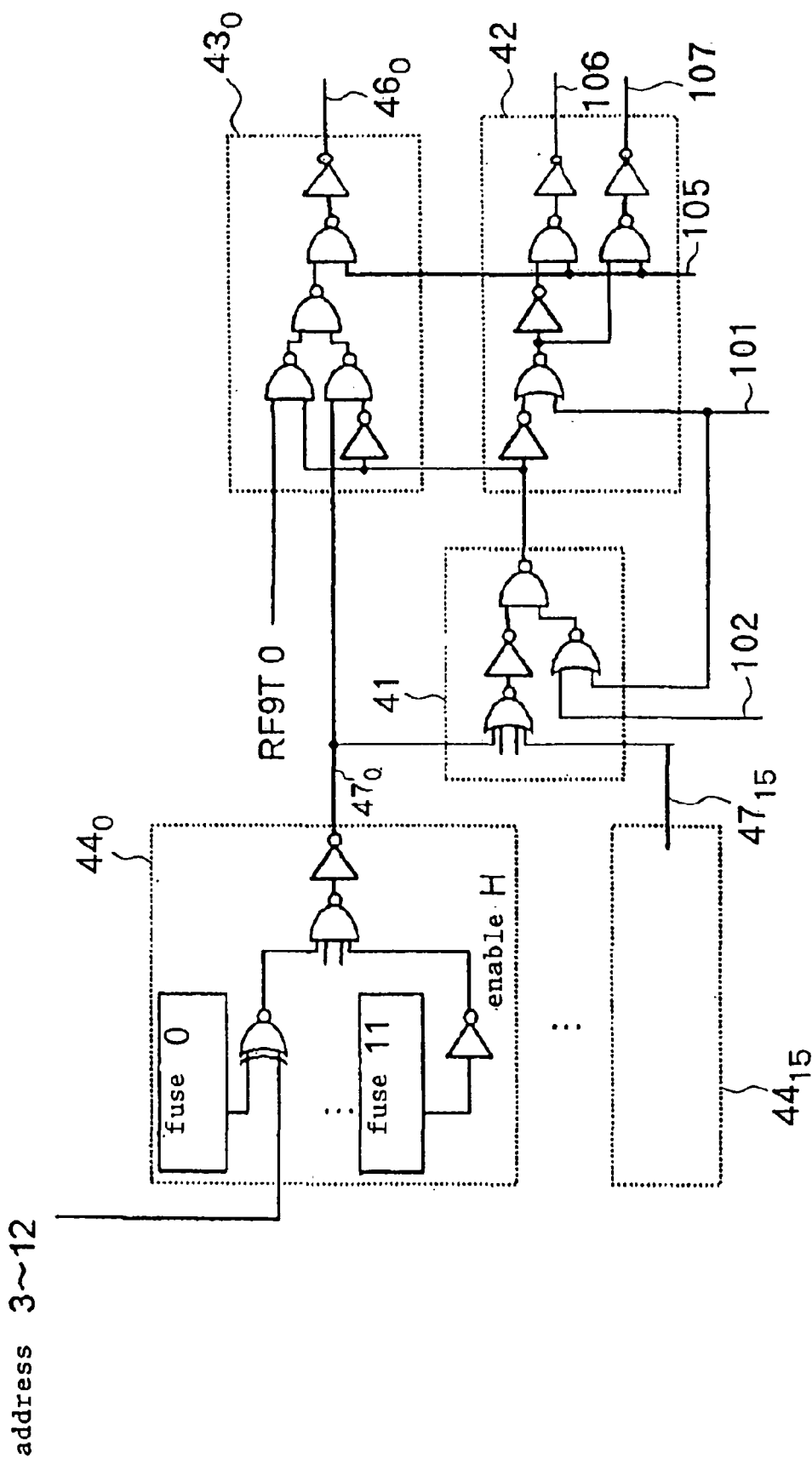
FIG. 8 is a circuit diagram showing an example of address comparison circuits $44_0$–$44_{15}$, determination circuit 41, mat address selection circuit $43_0$, and word line selection circuit 42 shown in FIG. 7.

FIG. 8 is a circuit diagram showing an example of address comparison circuits $44_0$–$44_{15}$ determination circuit 41, mat address selection circuit $43_0$, and word line selection circuit 42 in FIG. 7. In this case, only mat address selection circuit $43_0$ is shown, but the other mat address selection circuits $43_1$–$43_{15}$ have the same circuit structure.

Figure 9:
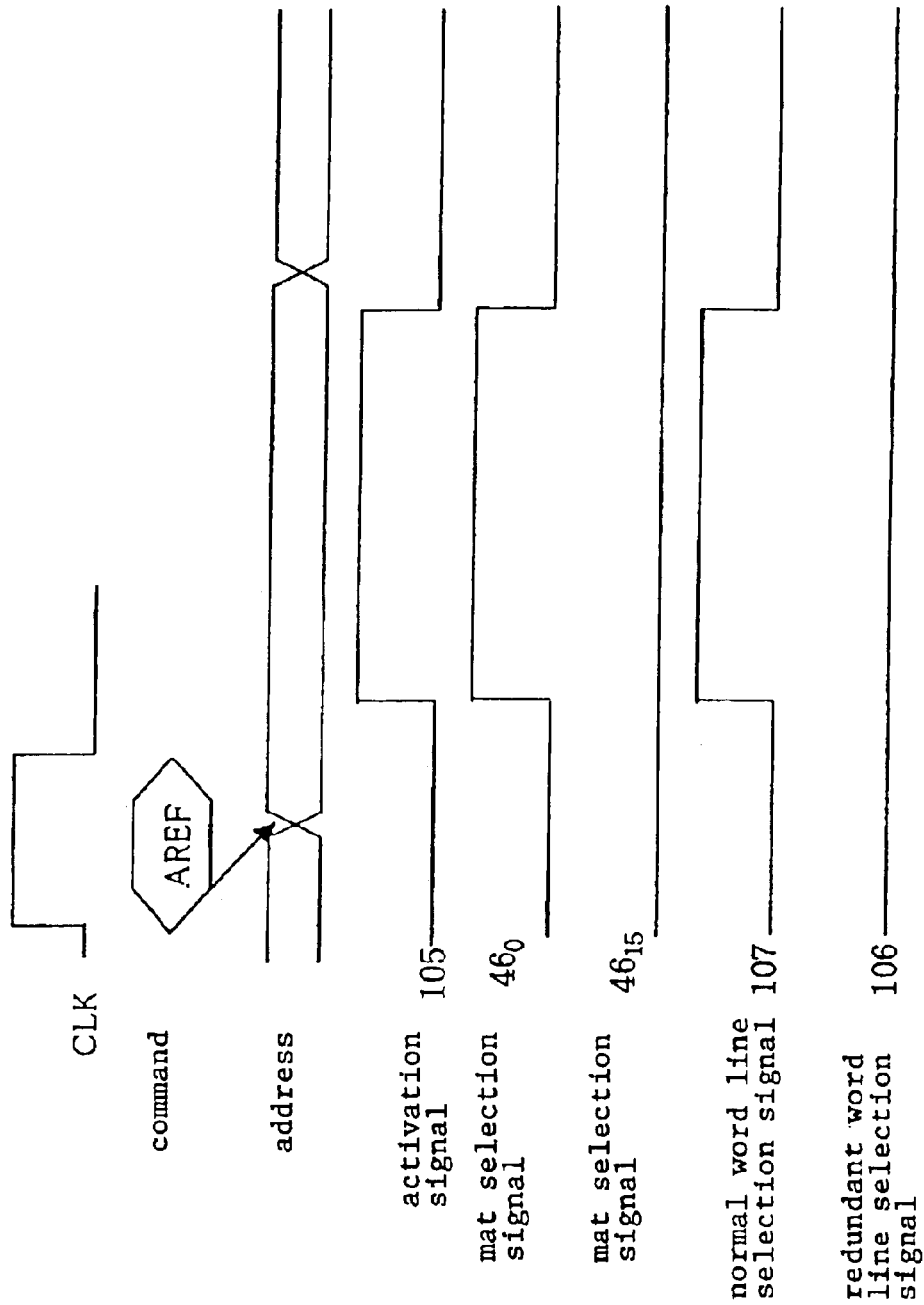
FIG. 9 is a timing chart showing the operation in the circuit diagram shown in FIG. 8 during non-remedy.

FIG. 9 is a timing chart showing the operation during non-remedy in which replacement by redundant word line is not to be performed in the circuit diagram shown in FIG. 8. The timing chart shown in FIG. 9 shows a case in which a normal word line in mat $10_0$ is selected, and in this case, mat selection signal $46_0$ is high level and normal word line selection signal 107 is high level. The mat that is indicated by the address that is received in this state is selected and the normal word line is activated.

Figure 10:
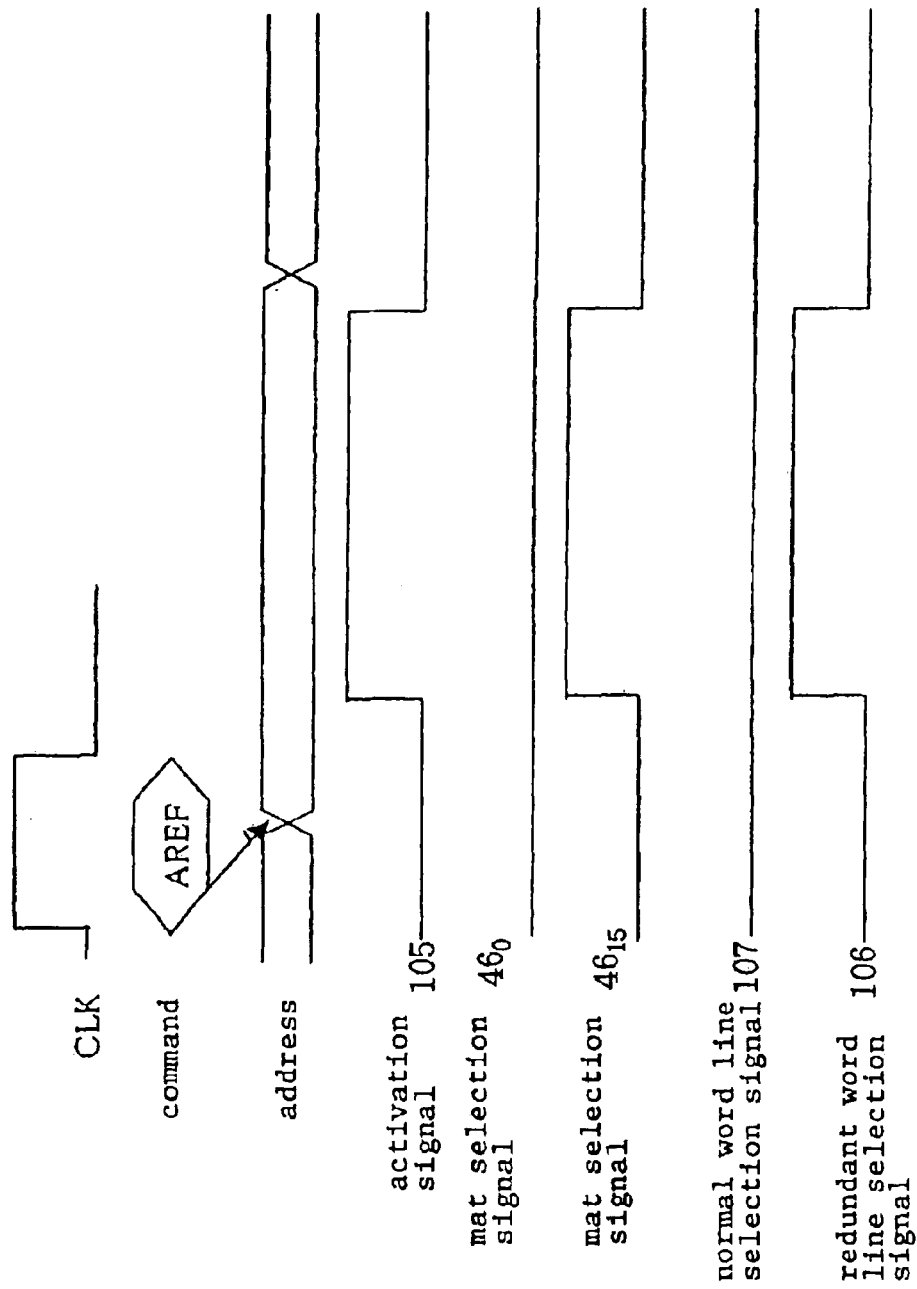
FIG. 10 is a timing chart showing the operation in the circuit diagram shown in FIG. 8 during remedy.

FIG. 10 is a timing chart showing the operation during remedy in which replacement is performed by a redundant word line in the circuit diagram shown in FIG. 8. The timing chart shown in FIG. 10 shows a case in which a normal word line in mat $10_0$ is replaced by a redundant word line in mat $10_{15}$, and in this case, mat selection signal $46_{15}$ becomes high level and redundant word line selection signal 106 becomes high level while mat selection signal $46_0$ remains unchanged at low level. A mat that is indicated by an address that is received in this state is not selected, while the remedying mat is selected and the redundant word line activated.

In addition, X-decoder 2 activates normal word lines that are specified by signals RF0T0–7, RF3T0–7, RF6T0–7 from predecoders $45_1$–$45_3$ when normal word line selection signal 107 from predecoder/remedy circuit 4 is high level, and activates redundant word lines that are specified by signals RF0T0–7 from predecoder $45_1$ when redundant word line selection signal 106 from predecoder/remedy circuit 4 is high level.

Figure 11:
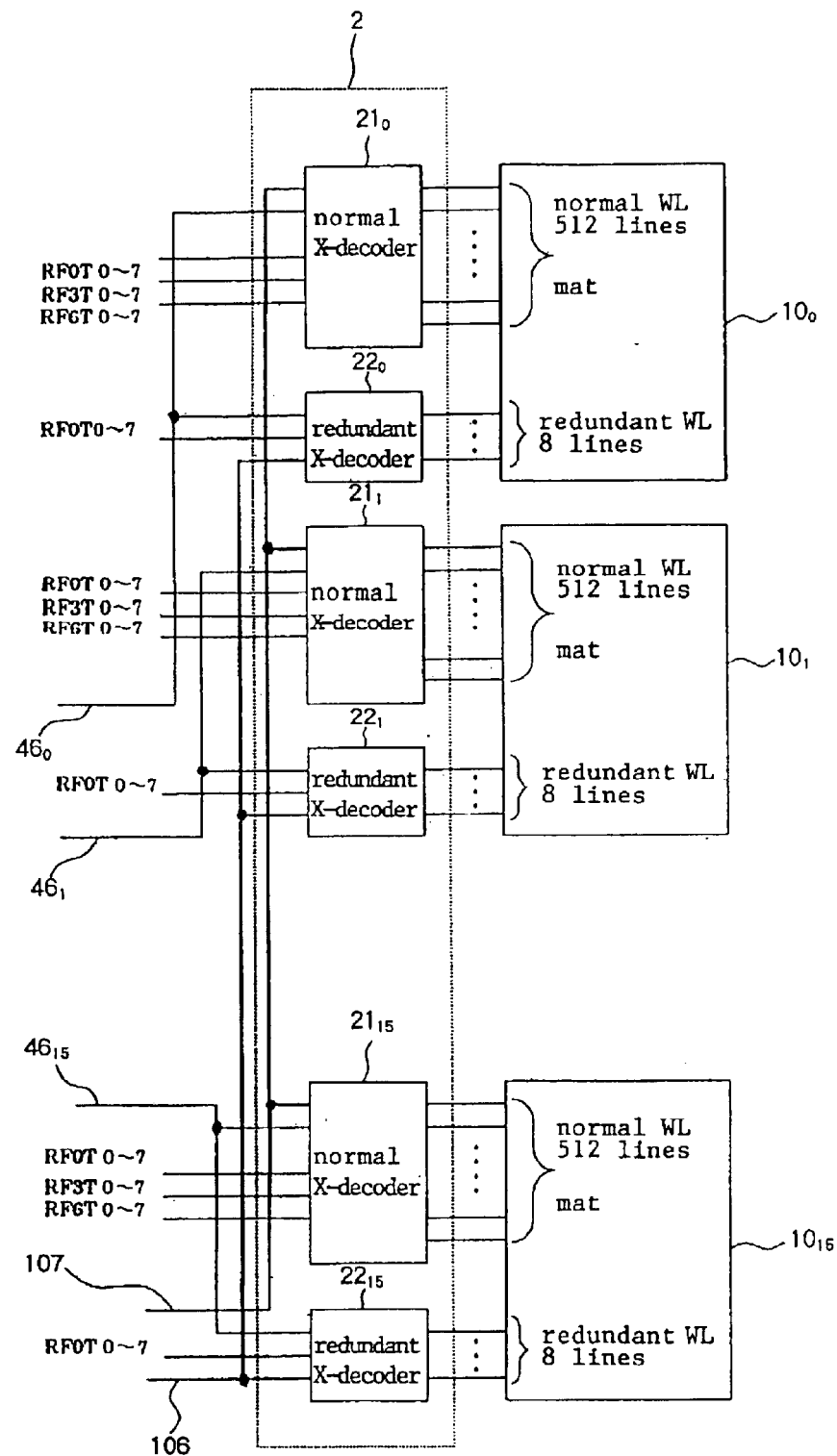
FIG. 11 is a block diagram showing the construction of X-decoder 2 in FIG. 6.

We next refer to FIG. 11, which shows the construction of X-decoder 2 in FIG. 6. This X-decoder 2 is made up by normal X-decoders $21_0$–$21_{15}$ and redundant X-decoders $22_0$–$22_{15}$.

Normal X-decoders $21_0$–$21_{15}$ are provided corresponding to each of normal word lines (WL) of mats $10_0$–$10_{15}$, and redundant X-decoders $22_0$–$22_{15}$ are provided corresponding to each of redundant word lines (WL) of mats $10_0$–$10_{15}$. Normal X-decoders $21_0$–$21_{15}$ each receive as input signals RF0T0–7 that are generated by predecoder $45_1$, signals RF3T0–7 that are generated by predecoder $45_2$, and signals RF6T0–7 that are generated by predecoder $45_3$, and determine which normal word lines in the mat are to be activated. Normal X-decoders $21_0$–$21_{15}$ also receive as input normal word line selection signal 107, and activate normal word lines only when normal word line selection signal 107 is high level.

Redundant X-decoders $22_0$–$22_{15}$ receive as input signals RF0T0–7 that have been generated by predecoder $45_1$, and determine which redundant word lines in the mat are to be activated. In addition, redundant X-decoders $22_0$–$22_{15}$ receive as input redundant word line selection signal 106, and activate redundant word lines only when redundant word line selection signal 106 is high level.

Figure 12:
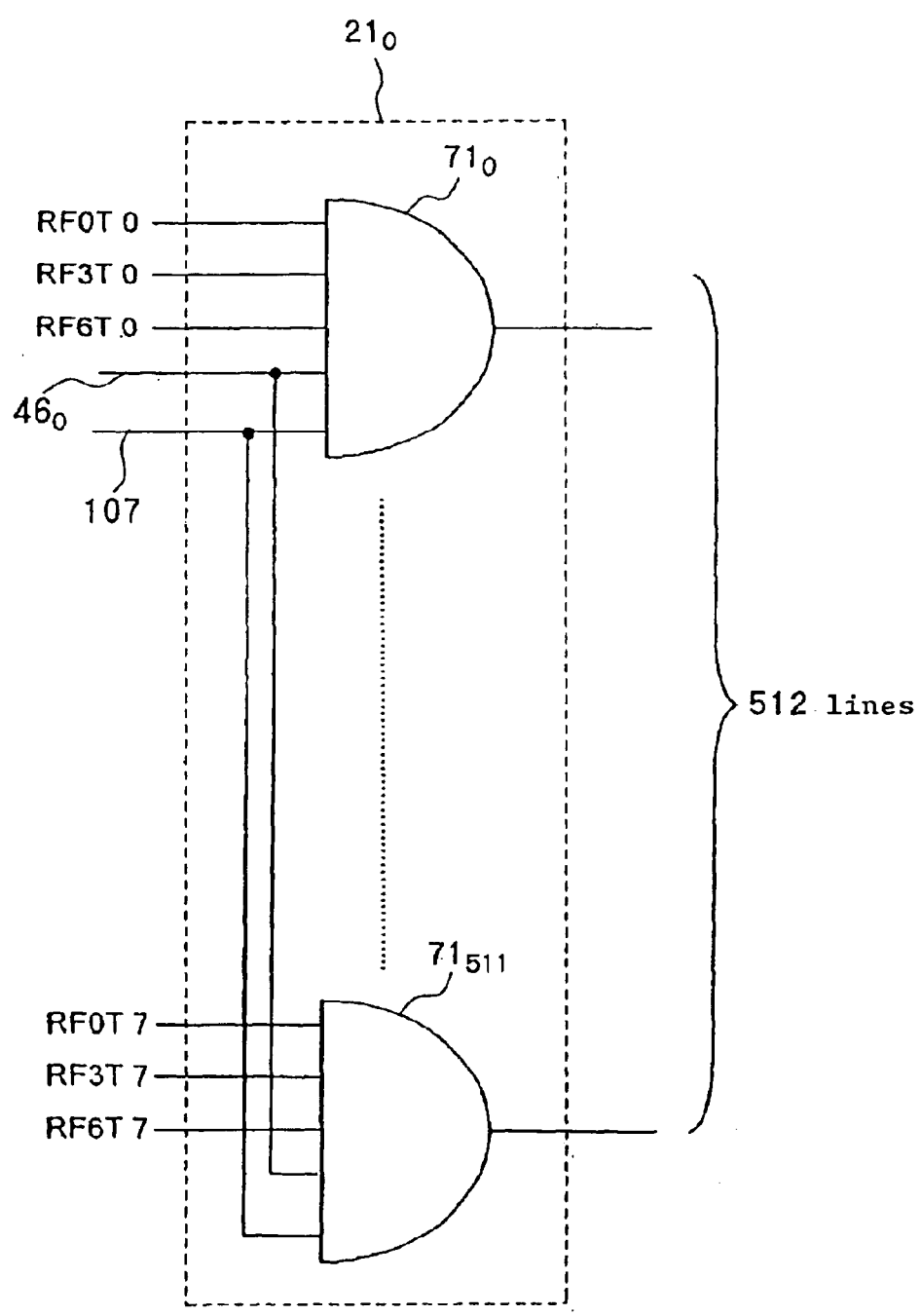
FIG. 12 is a circuit diagram showing an example of normal X-decoder $21_0$ in FIG. 11.

A more specific example of the circuit structure of normal X-decoder $21_0$ is shown in FIG. 12. In FIG. 12, normal X-decoder $21_0$ is constituted by 512 AND circuits $71_0$–$71_{511}$. As shown in FIG. 12, these 512 AND circuits $71_0$–$71_{511}$ receive as input mat selection signal $46_0$ and normal word line selection signal 107, and respective signals of signals RF0T0–7, RF3T0–7, and RF6T0–7 that are generated by predecoders $45_1$, $45_2$, and $45_3$. Although only the circuit structure of normal X-decoder $21_0$ is shown here, normal X-decoders $21_1$–$21_5$ can be realized by the same circuit structure.

Figure 13:
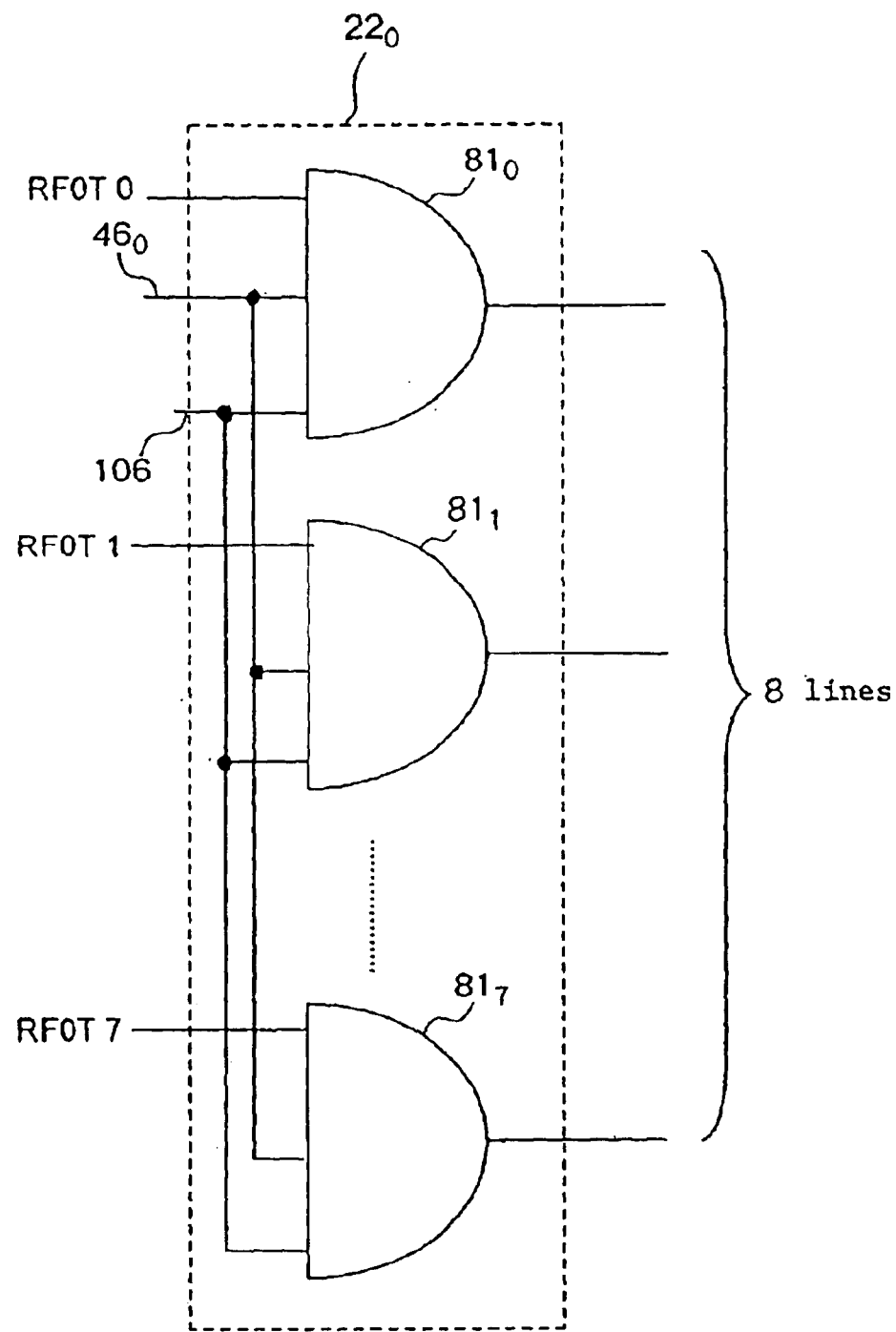
FIG. 13 is a circuit diagram showing an example of redundant X-decoder $22_0$ in FIG. 11.

We next refer to FIG. 13, which shows a specific example of the circuit structure of redundant X-decoder $22_0$. In FIG. 13, redundant X-decoder $22_0$ is constituted by eight AND circuits $81_0$–$81_7$. These eight AND circuits $81_0$–$81_7$ receive as input mat selection signal $46_0$, redundant word line selection signal 106, and a respective signal of signals RF0T0–7 that have been generated by predecoder $45_1$, as shown in FIG. 13. Although only the circuit structure of redundant X-decoder $22_0$ is shown here, redundant X-decoders $22_1$–$221_5$ can also be realized by the same circuit structure.

Figure 14:
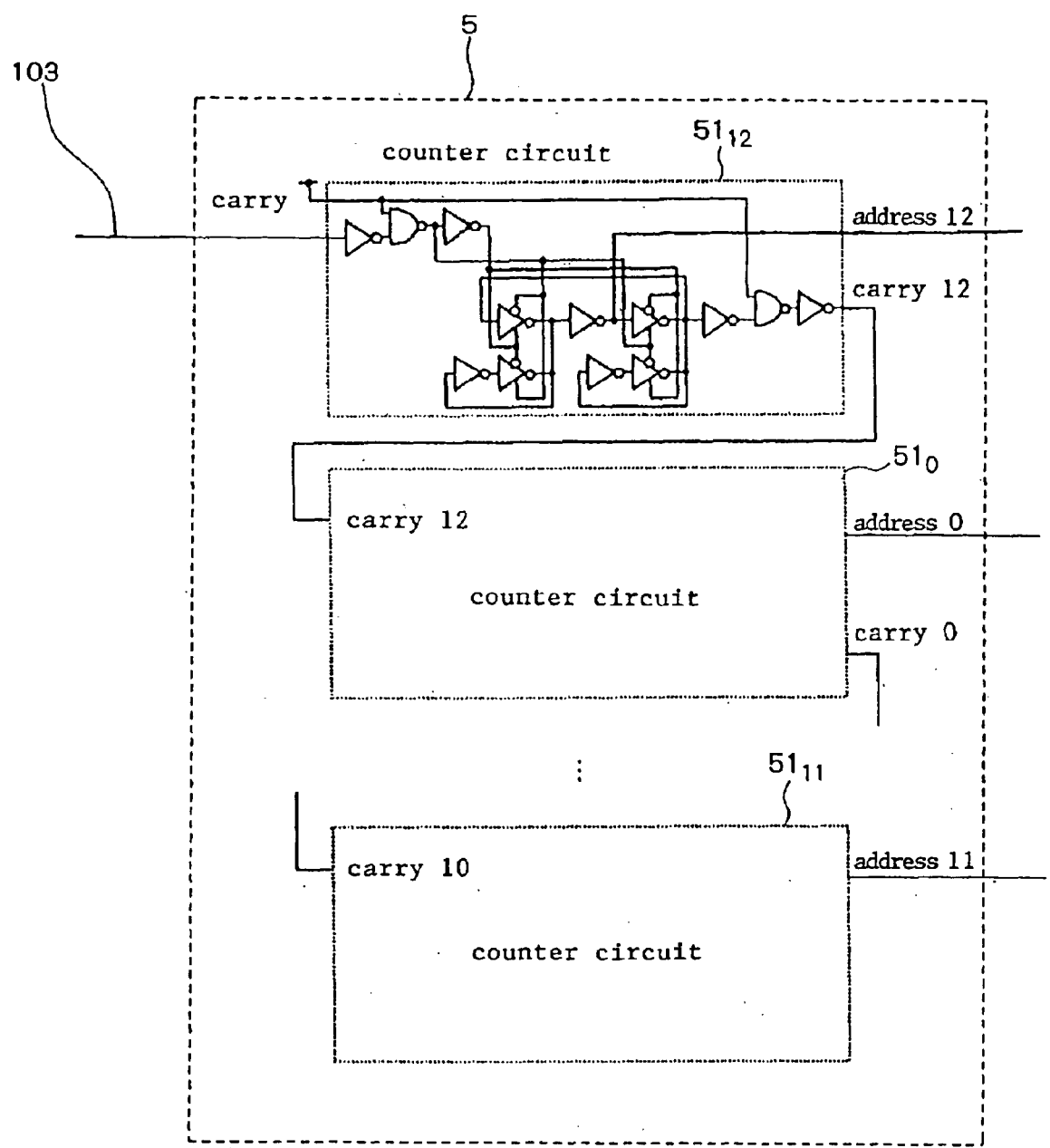
FIG. 14 is a circuit diagram showing an example of refresh counter 5 in FIG. 6.

We next refer to FIG. 14, which is a circuit diagram showing an example of the refresh counter 5 in FIG. 6. As shown in FIG. 14, refresh counter 5 is made up by 13 counter circuits $51_0$–$51_{12}$. By means of this circuit structure, refresh counter 5 successively generates and outputs addresses for selecting two normal word lines that do not belong to the same mat with each input of refresh activation signal 103, and then successively generates and outputs addresses for selecting two redundant word lines that do not belong to the same mat.

Figure 15:
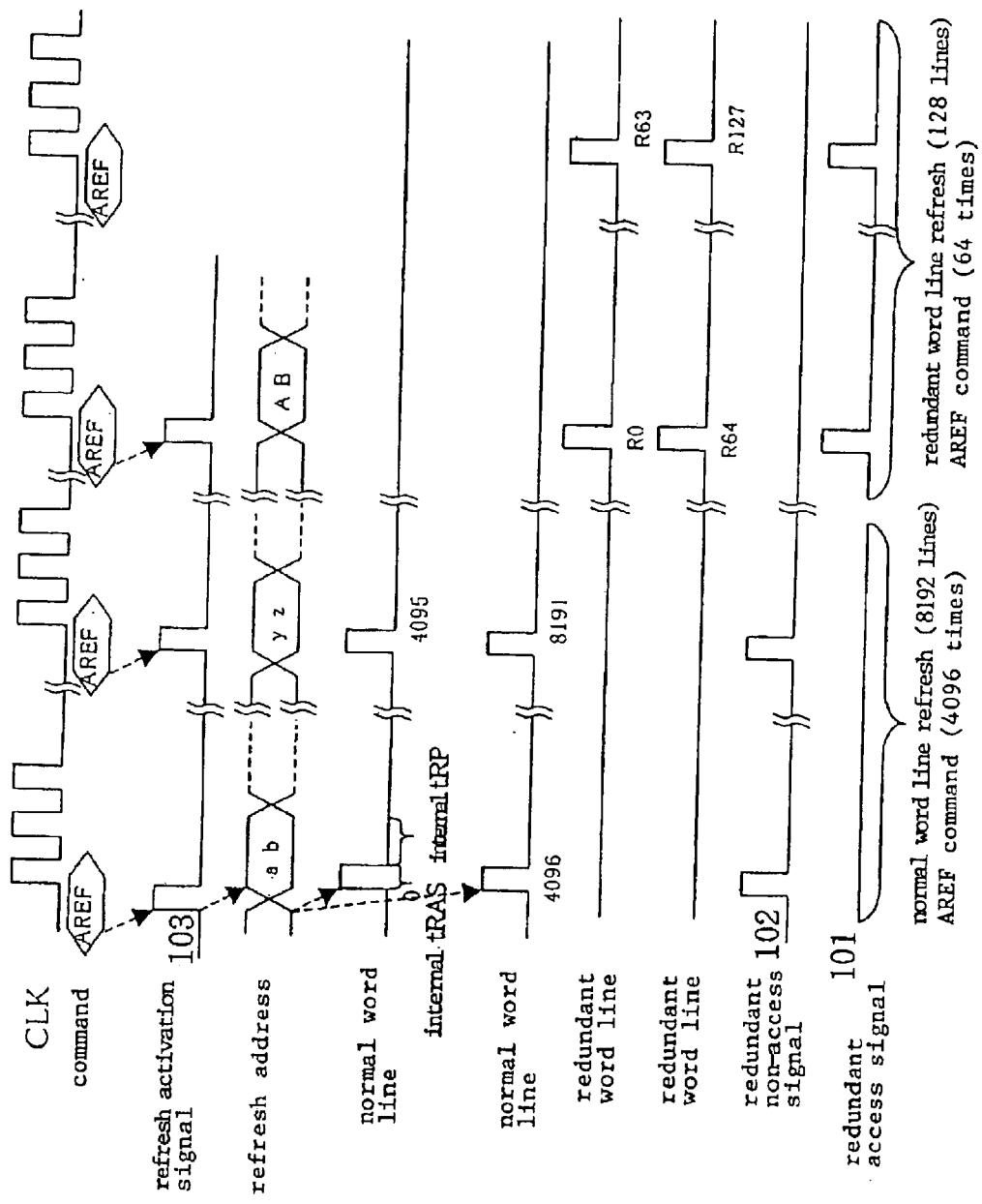
FIG. 15 is a timing chart for explaining the operation of semiconductor memory device of the first embodiment of the present invention.

We next refer to the timing chart of FIG. 15 to explain the details of the operation of the semiconductor memory device of the first embodiment of the present invention.

In the semiconductor memory device of this embodiment, refresh counter 5, with each input of refresh activation signal 103, successively generates and outputs: addresses for selecting normal word lines 0 and 4096, addresses for selecting normal word lines 1 and 4097, and so on up to addresses for selecting normal word lines 4095 and 8191; and then successively generates and outputs addresses for selecting redundant word lines R0 and R64, addresses for selecting redundant word lines R1 and R65, and so on up to addresses for selecting redundant word lines R63 and R127. While refresh counter 5 is successively generating and outputting addresses for selecting normal word lines, the output of redundancy non-access signal 102 from X-system control circuit 7 prevents replacement by redundant word lines. Then, while refresh counter 5 is successively generating and outputting addresses for selecting redundant word lines, the output of redundancy access signal 106 from X-system control circuit 7 prevents activation of normal word lines.

In this way, the input of initial refresh command 104 causes the simultaneous activation of normal word lines 0 and 4096, and the input of the next refresh command 104 causes the simultaneous activation of normal word lines 1 and 4097. Similarly, each input of refresh command 104 successively causes the simultaneous activation of two normal word lines that do not belong to the same mat. When the activation of all normal word lines has been completed, redundant word lines R0 and R64 are next simultaneously activated, and the input of next refresh command 104 brings about the simultaneous activation of redundant word lines R1 and R65. In the same way, each input of refresh command 104 causes the successive and simultaneous activation of two redundant word lines that do not belong to the same mat.

In the semiconductor memory device of the present embodiment, normal word lines and redundant word lines are each refreshed while preventing the replacement of normal word lines by redundant word lines, and as a result, two word lines in the same mat are not simultaneously activated despite the use of one refresh command to cause refreshing of two word lines. The semiconductor memory device of the present embodiment can therefore realize the external 8K Ref/internal 4K Ref standard without damaging stored data.

Although one refresh cycle is completed when 512×16= 8192 word lines have been refreshed in a semiconductor memory device of the prior art, 128 redundant word lines must be refreshed in addition to 8192 normal word lines to complete one refresh cycle in the semiconductor memory device of the present embodiment, meaning that 8192+128= 8320 word lines must be refreshed.

Second Embodiment:

Explanation next regards the semiconductor memory device of the second embodiment of the present invention.

The above-described semiconductor memory device of the first embodiment is able to realize the external 8K Ref/internal 4K Ref standard without causing damage to stored data, but since the amount of refreshing that is simultaneously performed is doubled, the amount of generated current is also doubled. As a result, array noise is increased compared to a case in which one word line is activated for each refresh operation. The semiconductor memory device of the present embodiment is directed to realizing the external 8K Ref/internal 4K Ref standard while minimizing the occurrence of this array noise.

In the present embodiment, the external 8K Ref/internal 4K Ref standard is realized by serially performing two refresh operations in a chip by means of one refresh command such that the time tRFC for one refresh operation does not become two times the tRFC in the 8K Ref standard.

Figure 16:
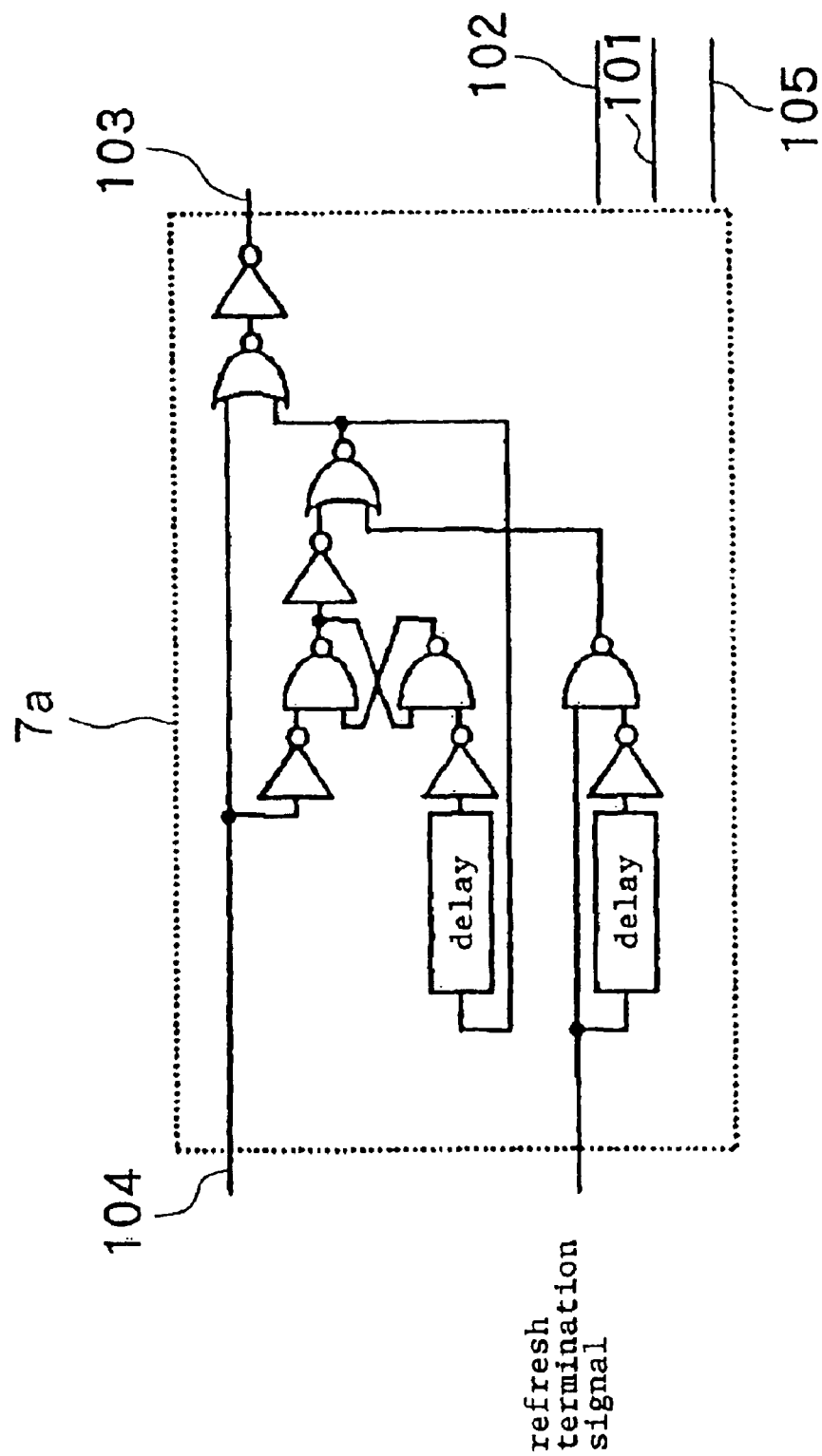
FIG. 16 is a circuit diagram showing a portion of an example of X-system control circuit 7a in the semiconductor memory device of the second embodiment of the present invention.

The semiconductor memory device of the present embodiment is a device in which X-system control circuit 7 in the semiconductor memory device of the first embodiment shown in FIG. 6 is replaced by X-system control circuit 7a shown in FIG. 16 and in which the counting method of refresh counter 5 is modified. This X-system control circuit 7a consecutively generates and outputs two refresh activation signals 103 with the input of one refresh command 104. FIG. 16 shows a circuit diagram of a portion of an example of X-system control circuit 7a in the semiconductor memory device of the present embodiment.

In addition, although refresh counter 5 in the first embodiment generated and output addresses for selecting two word lines with the input of one refresh activation signal 103, refresh counter 5 in the present embodiment differs in that it generates and outputs an address for selecting one word line with the input of one refresh activation signal 103. Accordingly, upon input of refresh activation signal 103 from X-system control circuit 7a, refresh counter 5 in the present embodiment successively generates and outputs with each input of refresh activation signal 103 addresses for selecting normal word lines such that the preceding address and succeeding address do not belong to the same mat; and after having generated addresses for selecting all normal word lines, successively generates with each input of refresh activation signal 103 addresses for selecting redundant word lines such that the preceding address and succeeding address do not belong to the same mat and outputs these addresses as refresh addresses.

Figure 17:
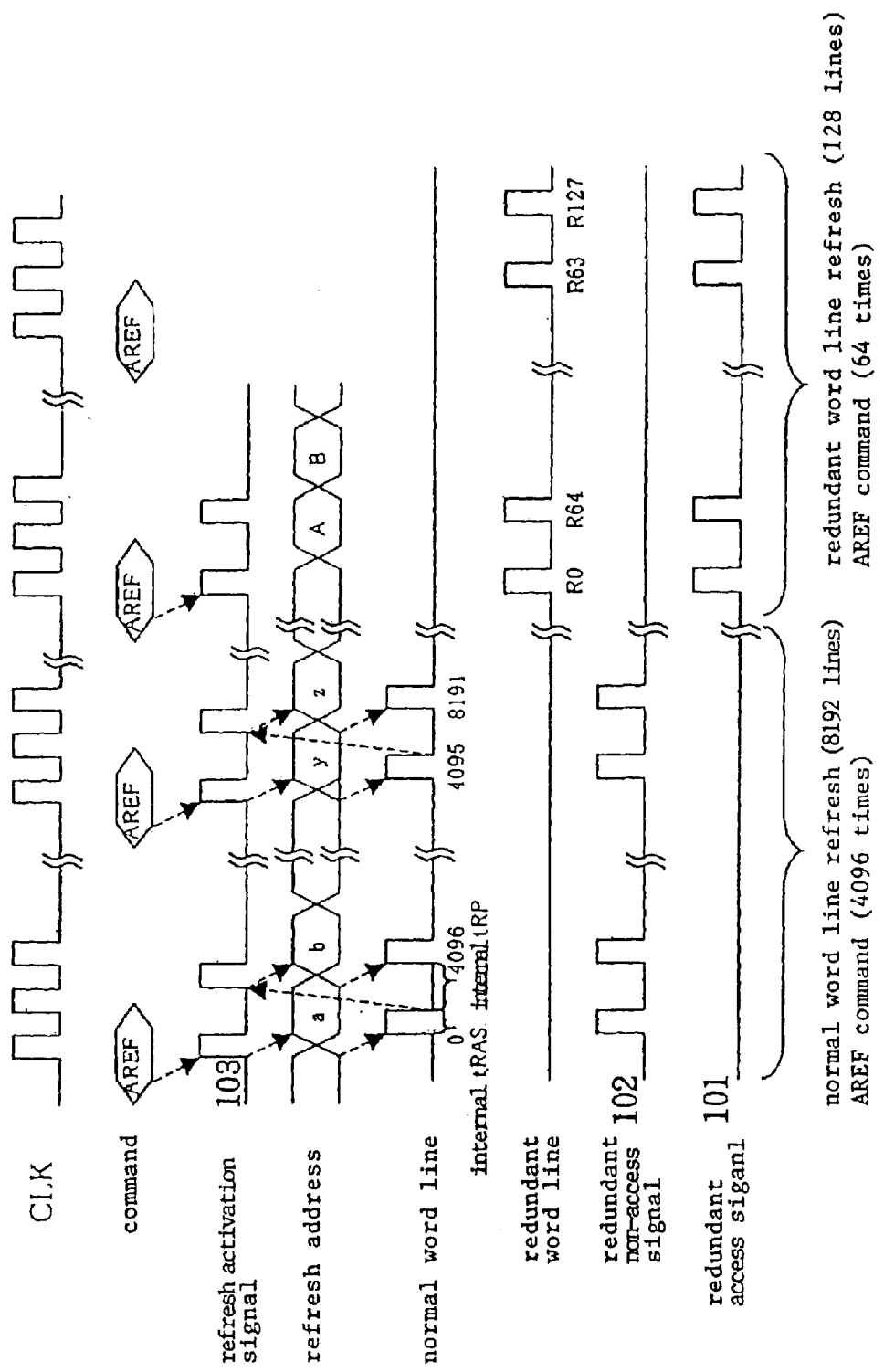
FIG. 17 is a timing chart for explaining the operation of the semiconductor memory device of the second embodiment of the present invention.

We next refer to the timing chart of FIG. 17 to explain details of the operation of the semiconductor memory device of the second embodiment of the present invention.

In the semiconductor memory device of the present embodiment, the input of refresh command 104 to X-system control circuit 7a causes two refresh activation signals 103 to be generated, whereupon, with each input of refresh activation signal 103, refresh counter 5 successively generates and outputs addresses for selecting normal word lines 0, 4096, 1, 4097, 2, 4098, 3, . . . , 4095 and 8191, and then successively generates and outputs addresses for selecting redundant word lines R0, R64, R1, R65, R2, . . . , R63, and R127. While refresh counter 5 is successively generating and outputting addresses for selecting normal word lines, the output of redundancy non-access signal 102 from X-system control circuit 7a prevents replacement by redundant word lines. While refresh counter 5 is successively generating and outputting addresses for selecting redundant word lines, the output of redundancy access signal 101 from X-system control circuit 7a prevents activation of normal word lines.

In this way, the input of the initial refresh command 104 causes normal word lines 0 and 4096 to be consecutively activated, and the input of the next refresh command 104 causes normal word lines 1 and 4097 to be consecutively activated. Similarly, each input of refresh command 104 causes the successive and consecutive activation of two normal word lines that do not belong to the same mat. Then, when the activation of all normal word lines has been completed, redundant word lines R0 and R64 are next consecutively activated, following which the input of the next refresh command 104 causes activation of redundant word lines R1 and R65. In the same way, two redundant word lines not belonging to the same mat are consecutively and successively activated with each input of refresh command 104.

Figure 18:
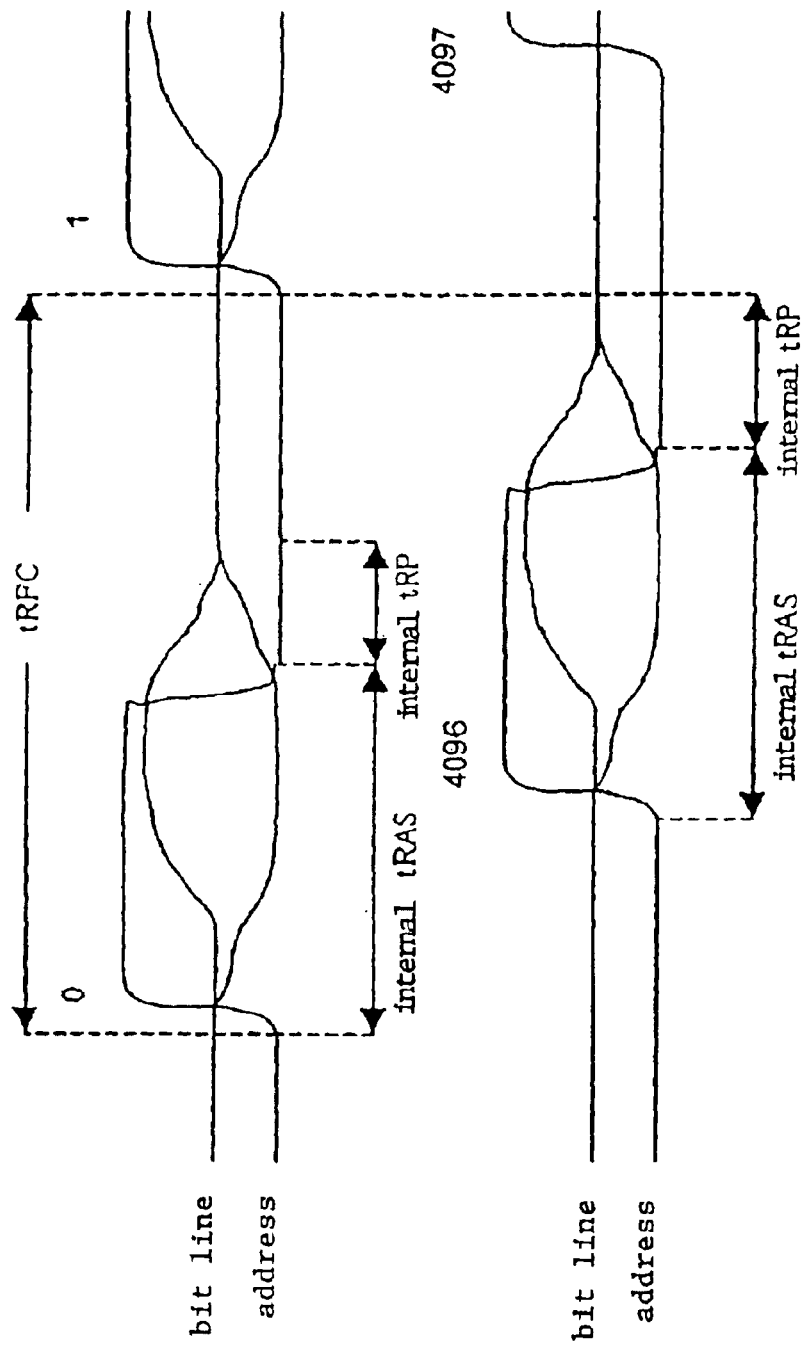
FIG. 18 is a timing chart for explaining tRFC in the semiconductor memory device of the second embodiment of the present invention.

By carrying out the above-described process in the semiconductor memory device of the present embodiment, word lines in the same mat are not consecutively activated, similar to the semiconductor memory device of the previously described first embodiment in which word lines in the same mat are not simultaneously activated. Thus, as shown in FIG. 18, after activation of a particular word line, the present embodiment allows the process for activation of the next word line to begin without waiting the time interval for bit line amplification and bit line precharging by a sense amplifier, i.e., the present embodiment allows an overlap in processing.

For this reason, the present embodiment enables realization of the external 8K Ref/internal 4K Ref standard wherein, although the time tRFC for one refresh operation is longer than tRFC in the 8K Ref standard, twice the time need not be taken. In addition, since the same amount of refreshing can be carried out simultaneously as in the prior art, there is no increase in array noise as compared with a semiconductor memory device of the prior art.

However, due to the shifting of the timing of the refresh operation of two word lines, the refresh cycle for refreshing all word lines is longer than in the semiconductor memory device of the first embodiment.

Although the foregoing explanation used a case in which one refresh command causes two word lines to be refreshed either simultaneously or serially and consecutively in the above-described first and second embodiments, the present invention is not limited to these forms but can be similarly applied to cases in which one refresh command causes the simultaneous or serial and consecutive activation of three or more word lines.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device having a memory cell array that is constituted by a plurality of mats that are each provided with normal word lines and redundant word lines, said semiconductor memory device comprising:

an X-system control circuit for, upon input of a refresh command instructing a refresh operation, generating and outputting a refresh activation signal that indicates the start of a refresh operation, outputting a redundancy non-access signal for preventing replacement by redundant word lines when refreshing normal word lines, and outputting a redundancy access signal for preventing activation of normal word lines when refreshing redundant word lines;

a refresh counter for, upon input of a refresh activation signal from said X-system control circuit, successively generating and outputting addresses for selecting two normal word lines that do not belong to the same mat with each input of a refresh activation signal, and, after having generated addresses for selecting all normal word lines, successively generating addresses for selecting two redundant word lines that do not belong to the same mat with each input of a refresh activation signal and outputting these generated addresses as refresh addresses;

a remedy circuit for activating a normal word line selection signal for enabling selection of normal word lines when said redundancy non-access signal is active, and activating a redundant word line selection signal for enabling selection of redundant word lines when said redundancy access signal is active; and an X-decoder for simultaneously activating two normal word lines instructed by said refresh addresses when said normal word line selection signal is active, and simultaneously activating two redundant word lines that are instructed by said refresh addresses when said redundant word line selection signal is active.

2. A semiconductor memory device having a memory cell array that is constituted by a plurality of mats that are each provided with normal word lines and redundant word lines, said semiconductor memory device comprising:

an X-system control circuit for, upon input of a refresh command instructing a refresh operation, generating and outputting two refresh activation signals that indicate the start of refresh operations, outputting a redundancy non-access signal for preventing replacement by redundant word lines when refreshing normal word lines, and outputting a redundancy access signal for preventing activation of normal word lines when refreshing redundant word lines;

a refresh counter for, upon input of a refresh activation signal from said X-system control circuit, successively generating and outputting addresses for selecting normal word lines such that preceding and succeeding addresses do not belong to the same mat with each input of a refresh activation signal, and after having generated addresses for selecting all normal word lines, successively generating addresses for selecting redundant word lines such that preceding and succeeding addresses do not belong to the same mat with each input of a refresh activation signal and outputting these generated addresses as refresh addresses;

a remedy circuit for activating a normal word line selection signal for enabling selection of normal word lines when said redundancy non-access signal is active, and activating a redundant word line selection signal for enabling selection of redundant word lines when said redundancy access signal is active; and an X-decoder for consecutively activating two normal word lines that are instructed by said refresh addresses when said normal word line selection signal is active, and consecutively activating two redundant word lines that are instructed by said refresh addresses when said redundant word line selection signal is active.

3. A refresh control method for controlling a refresh operation in a semiconductor memory device having a memory cell array that is constituted by a plurality of mats each provided with normal word lines and redundant word lines; said method comprising steps of:

successively selecting and simultaneously activating two normal word lines that do not belong to the same mat while preventing replacement by redundant word lines; and successively selecting and simultaneously activating two redundant word lines that do not belong to the same mat while preventing activation of normal word lines.

4. A refresh control method for controlling a refresh operation in a semiconductor memory device having a memory cell array that is constituted by a plurality of mats each provided with normal word lines and redundant word lines; said method comprising steps of:

successively selecting and consecutively activating two normal word lines that do not belong to the same mat while preventing replacement by redundant word lines; and successively selecting and consecutively activating two redundant word lines that do not belong to the same mat while preventing activation of normal word lines.

* * * * *